United States Patent
Tominaga et al.

(10) Patent No.: US 7,635,046 B2
(45) Date of Patent: Dec. 22, 2009

(54) ELECTRIC POWER STEERING APPARATUS

(75) Inventors: Tsutomu Tominaga, Tokyo (JP);
Yasushi Yamaguchi, Tokyo (JP);
Tadayuki Fujimoto, Tokyo (JP)

(73) Assignee: Mitsubishi Electric Corp., Tokyo (JP)

( * ) Notice: Subject to any disclaimer, the term of this patent is extended or adjusted under 35 U.S.C. 154(b) by 297 days.

(21) Appl. No.: 11/487,447

(22) Filed: Jul. 17, 2006

(65) Prior Publication Data

US 2007/0205038 A1    Sep. 6, 2007

(30) Foreign Application Priority Data

Mar. 6, 2006    (JP)    ............... 2006-059687

(51) Int. Cl.
*B62D 5/04*    (2006.01)
(52) U.S. Cl. ............... 180/444; 361/720; 361/736
(58) Field of Classification Search ............... 180/444; 361/720, 736
See application file for complete search history.

(56) References Cited

U.S. PATENT DOCUMENTS

| | | | | |
|---|---|---|---|---|
| 6,091,604 | A * | 7/2000 | Plougsgaard et al. | ........ 361/707 |
| 6,650,546 | B2 * | 11/2003 | Nelson et al. | ........ 361/738 |
| 7,301,755 | B2 * | 11/2007 | Rodriguez et al. | ........ 361/676 |
| 2002/0060105 | A1 * | 5/2002 | Tominaga et al. | ........ 180/443 |
| 2003/0173920 | A1 * | 9/2003 | Tominaga et al. | ........ 318/432 |
| 2005/0045450 | A1 * | 3/2005 | Geib et al. | ........ 194/318 |
| 2005/0167183 | A1 * | 8/2005 | Tominaga et al. | ........ 180/444 |
| 2006/0108884 | A1 * | 5/2006 | Shiino et al. | ........ 310/89 |

FOREIGN PATENT DOCUMENTS

| | | |
|---|---|---|
| JP | 2-114697 A | 4/1990 |
| JP | 02-114697 A | 4/1990 |
| JP | 05-037163 A | 2/1993 |
| JP | 2000-166161 A | 6/2000 |
| JP | 2001-110481 A | 4/2001 |
| JP | 2002-314016 A | 10/2002 |
| JP | 2004-237832 A | 8/2004 |
| JP | 2004-254359 A | 9/2004 |
| JP | 2005-212722 A | 8/2005 |
| JP | 2006-032277 A | 2/2006 |

OTHER PUBLICATIONS

Japanese Office Action dated Sep. 9, 2008 (3 pages).

* cited by examiner

*Primary Examiner*—Lesley D Morris
*Assistant Examiner*—Maurice Williams
(74) *Attorney, Agent, or Firm*—Sughrue Mion, PLLC

(57) ABSTRACT

An electric power steering apparatus requires no external connecting member connecting between a power main body and a control main body, and hence can be reduced in size and cost, and the reliability of electrical connection between the power main body and the control main body can be improved. High current parts constituting the power main body and low current parts constituting the control main body are mounted on opposite sides of a circuit board, and are electrically connected with one another via conductor layers of the circuit board and through holes formed therein.

36 Claims, 9 Drawing Sheets

ELECTRIC POWER STEERING APPARATUS

FIELD OF THE INVENTION

The present invention relates to an electric power steering apparatus equipped with an electric motor for outputting assist torque to the steering wheel of a vehicle, and a control unit for controlling the driving of the electric motor.

DESCRIPTION OF THE RELATED ART

In the past, there has been known an electric power steering apparatus which is equipped with an electric motor for outputting assist torque to the steering wheel of a vehicle, and a control unit mounted on the electric motor for controlling the driving of the electric motor (see, for example, a first patent document: Japanese patent application laid-open No. 2005-212722).

The control unit of the electric power steering apparatus includes a power board on which high current parts such as a plurality of semiconductor switching elements for switching a current of the electric motor, capacitors for absorbing current ripples, etc., are mounted, a control board on which low current parts such as a microcomputer for generating a drive signal to control the driving of the semiconductor switching elements, etc., are mounted, and a housing to which an electrically conductive circuit board, which constitutes a wiring pattern, and motor terminals are insert molded with an insulating resin. These components form a three-layer structure in which the power board, the housing and the control board are laminated one over another in this order.

In the above-mentioned electric power steering apparatus, the control unit has the three-layer structure including the power board, the housing and the control board, so the height of the control unit as a whole becomes large, and connecting members for electrically connecting the power board, the housing and the control board to one another are needed, thus increasing the number of connected locations.

As a result, there is the following problem. That is, the apparatus becomes large in size, and additional time and equipment are required to assemble the apparatus, thus increasing the cost of manufacture and reducing the reliability of electrical connections.

SUMMARY OF THE INVENTION

Accordingly, the present invention is intended to obviate the problem as referred to above, and has for its object to provide an electric power steering apparatus which can be reduced in size and cost, and improved in the reliability of electrical connections by forming a power board, a housing and a control board into a single multilayer board or substrate, thereby making unnecessary connecting members for electrically connecting the power board, the housing and the control board to one another.

Bearing the above object in mind, according to the present invention, there is provided an electric power steering apparatus including an electric motor for outputting assist torque to a steering wheel of a vehicle, and a control unit for controlling the driving of the electric motor. The control unit includes: a power main body including a plurality of semiconductor switching elements for switching a current supplied to the electric motor in accordance with torque assisting the steering wheel, and a plurality of high current parts including capacitors for absorbing ripples of the current; a control main body that includes a plurality of low current parts including a microcomputer for generating drive signals to control the driving of the semiconductor switching elements based on the steering torque of the steering wheel; a circuit board that has a plurality of insulating layers and a plurality of conductor layers forming wiring patterns laminated one over another, and a plurality of through holes formed therethrough, with the power main body and the control main body being mounted thereon; and a heat sink that receives the circuit board and is made of a metal material of high conductivity. The high current parts and the low current parts are mounted on the opposite side surfaces of the circuit board, respectively, and are electrically connected with one another through the conductor layers and the through holes.

According to the electric power steering apparatus of the present invention, by forming a power board, a housing and a control board into a single multilayer board, it is possible to reduce the size and cost of the apparatus and to improve the reliability of electrical connections, thereby making unnecessary individual connecting members for electrically connecting the power board, the housing and the control board to one another.

The above and other objects, features and advantages of the present invention will become more readily apparent to those skilled in the art from the following detailed description of a preferred embodiment of the present invention taken in conjunction with the accompanying drawings.

DESCRIPTION OF THE PREFERRED EMBODIMENT

Figure 1:
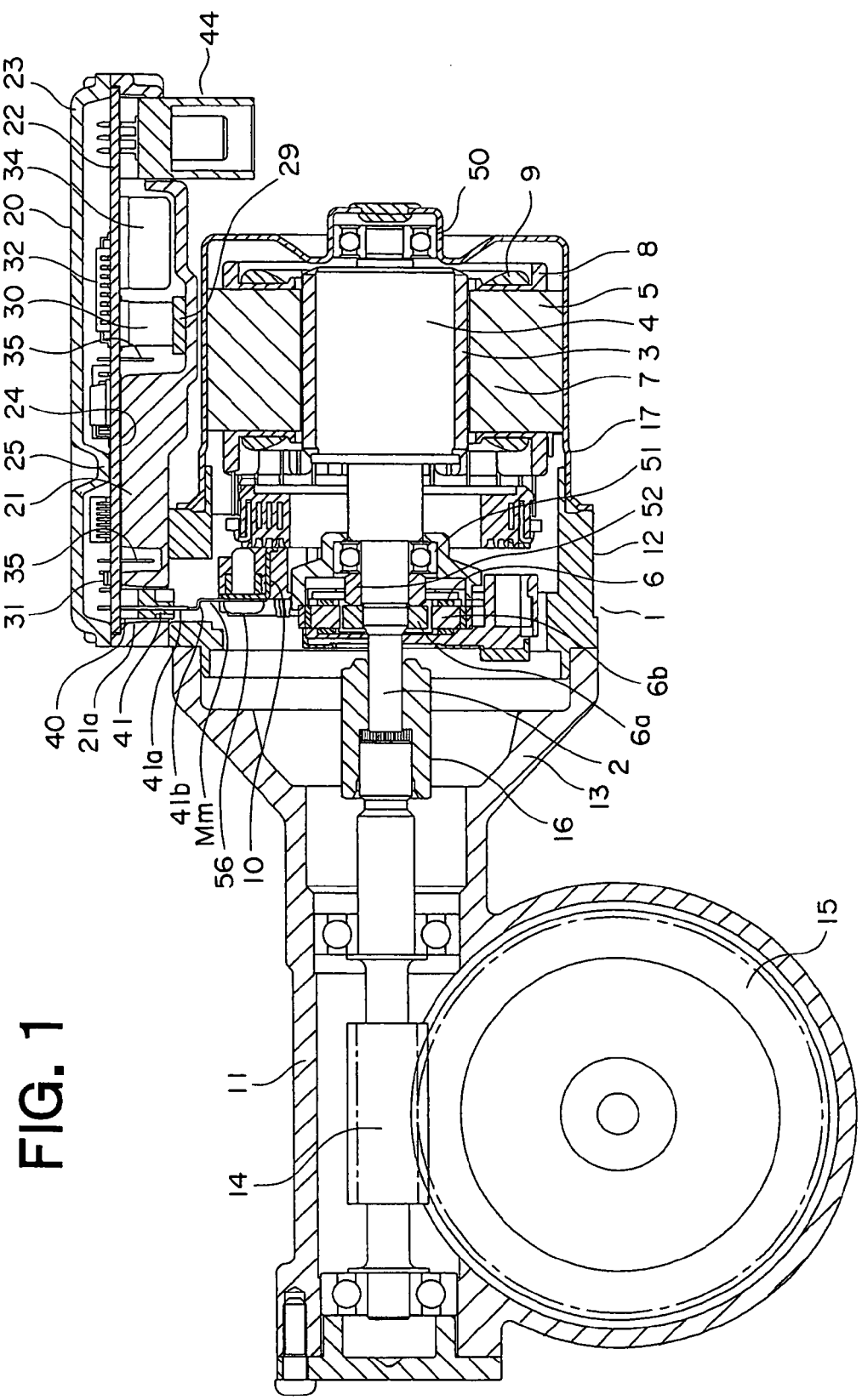
FIG. 1 is a cross sectional view showing an electric power steering apparatus according to a first embodiment of the present invention.

Now, a preferred embodiment of the present invention will be described in detail while referring to the accompanying drawings. Throughout respective figures, the same or corresponding members or parts are identified by the same reference numerals and characters.

Embodiment 1

Figure 2:
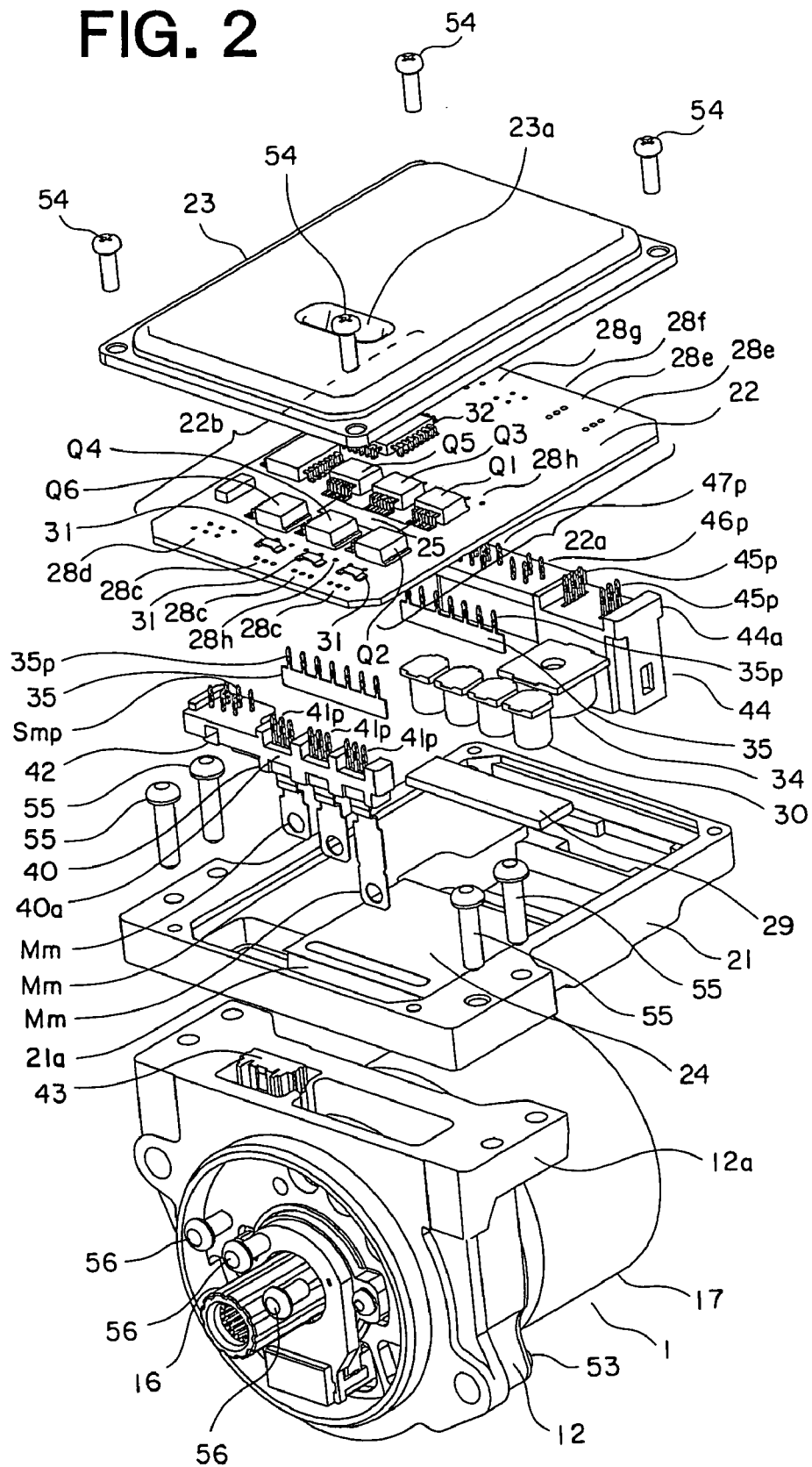
FIG. 2 is an exploded perspective view showing the electric power steering apparatus in FIG. 1.

FIG. 1 is a cross sectional view that shows an electric power steering apparatus according to a first embodiment of the present invention. FIG. 2 is an exploded perspective view that shows the electric power steering apparatus in FIG. 1.

In this figure, in this electric power steering apparatus, there is used an electric motor 1 in the form of a three-phase blushless motor.

The electric motor 1 is provided with an output shaft 2, a rotor 4 with a permanent magnet 3 having eight magnetic poles fixedly attached to the output shaft 2, a stator 5 arranged around the rotor 4, and a rotational position sensor 6 arranged at an output side of the output shaft 2 for detecting the rotational position of the rotor 4.

The stator 5 has twelve salient poles 7 in opposition to the outer periphery of the permanent magnet 3, insulators 8 attached to these salient poles 7, respectively, and armature windings 9 wound around the insulator 8 and connected with three-phases U, V and W. The armature windings 9 have their three end portions connected with three winding terminals 10, respectively, extending in an axial direction at the output side of the output shaft 2.

The rotational position sensor 6 is composed of a resolver, and has a rotor 6a and a stator 6b. The outside diameter or contour of the rotor 6a is formed into a special curve so that the permeance of a diametral clearance or gap between the stator 6b and the rotor 6a changes in a sinusoidal manner in accordance with a relative angle therebetween. An exciting coil and two sets of output coils are wound around the stator 6b for detecting a change in the diametral gap between the rotor 6a and the stator 6b to generate two-phase output voltages that change in a sine wave and in a cosine wave.

The electric motor 1 is fixedly attached to a speed reduction mechanism in the form of a reduction gear 11.

The reduction gear 11 includes a gear case 13 to which a housing 12 of the electric motor 1 is attached, a worm gear 14 that is arranged in the gear case 13 for decelerating the rotation of the output shaft 2, and a worm wheel 15 that is in meshing engagement with the worm gear 14. The worm gear 14 is formed, at an end portion thereof near the electric motor 1, with a spline. A coupling 16 with a spline formed on its inner side is press-fitted into an end portion of the output shaft 2 near the reduction gear 11. Thus, the coupling 16 and the one end portion of the worm gear 14 are coupled with each other through their splines, so that torque can be transmitted from the electric motor 1 to the reduction gear 11.

A control unit 20 for controlling the driving of the electric motor 1 is fixedly secured by screws 55 to a bracket 12a that is formed at an upper portion of the housing 12 of the electric motor 1, as shown in the FIG. 2.

The control unit 20 includes a heat sink 21 made of aluminum of high thermal conductivity, a circuit board 22 arranged in the heat sink 21, a cover 23 made of aluminum that cooperates with the heat sink 21 so as to receive the circuit board 22, etc., in its interior.

The heat sink 21, the circuit board 22, and the cover 23 are arranged in parallel to the axial direction of the electric motor 1, and the heat sink 21 is fixedly attached to the bracket 12a of the electric motor 1 by means of the screws 55. The circuit board 22 is fixedly secured to the heat sink 21 by screws 54 with a part of the peripheral portion thereof being sandwiched between the heat sink 21 and the cover 23.

The circuit board 22 is formed of a six-layer substrate, as shown in the FIGS. 3 through 5 and FIGS. 7 through 9, and includes outermost conductor layers 26a, 26f each in the form of a copper layer having a thickness of 60 micrometers. At the inner side of the outermost conductor layers 26a, 26f, there are arranged five interlayer insulating layers 27a, 27b, 27c, 27d, 27e and four conductor layers 26b, 26c, 26d, 26e of copper which are alternately laminated one over another. The inner conductor layers 26b, 26c, 26d, 26e are each formed of a copper layer having a thickness of 105 micrometers, which is larger than the thickness of each of the outermost layers 26a, 26f.

The circuit board 22 has through holes 28a, 28c, 28d, 28e, 28f, 28g, 28h formed therethrough. A copper plated layer is formed on an inner surface of each of the through holes 28a, 28c through 28h. This copper plated layer is electrically connected to the conductor layers 26a, 26b, 26c, 26d, 26e, 26f that are exposed to the through holes 28a, 28c through 28h, thereby to form individual wiring patterns.

High current parts such as semiconductor switching elements (e.g., FET) Q1 through Q6, which constitute a three-phase bridge circuit for switching the motor current of the electric motor 1, shunt resistors 31 that detect the current of the electric motor 1, etc., are surface mounted by soldering on the outermost conductive layer 26f of the circuit board 22 on its surface near the cover 23.

Also, high current parts such as capacitors 30 for absorbing ripples of the motor current, a coil 34 for preventing electromagnetic noise generated upon switching of semiconductor switching elements Q1 through Q6 from flowing out to the outside, etc., are surface mounted by soldering on the outermost conductor layer 26a of the circuit board 22 on its surface near the heat sink 21.

A power main body 22a comprising the high current parts such as the semiconductor switching elements Q1 through Q6, the shunt resistors 31, the capacitors 30, the coil 34, etc., is installed on the circuit board 22 at the right side in a longitudinal direction thereof, as shown in FIG. 2.

Each of these high current parts that constitute the power main body 22a is composed of a surface mount part.

The inner conductor layers 26b, 26c, 26d, 26e of the circuit board 22 are each formed to have a large thickness so as to be able to flow a large current and obtain high heat dissipation. On the other hand, the outermost conductor layers 26a, 26f, on which the parts are mounted, are each formed to have a thickness thinner than the inner conductor layers 26b, 26c, 26d, 26e.

Figure 3:
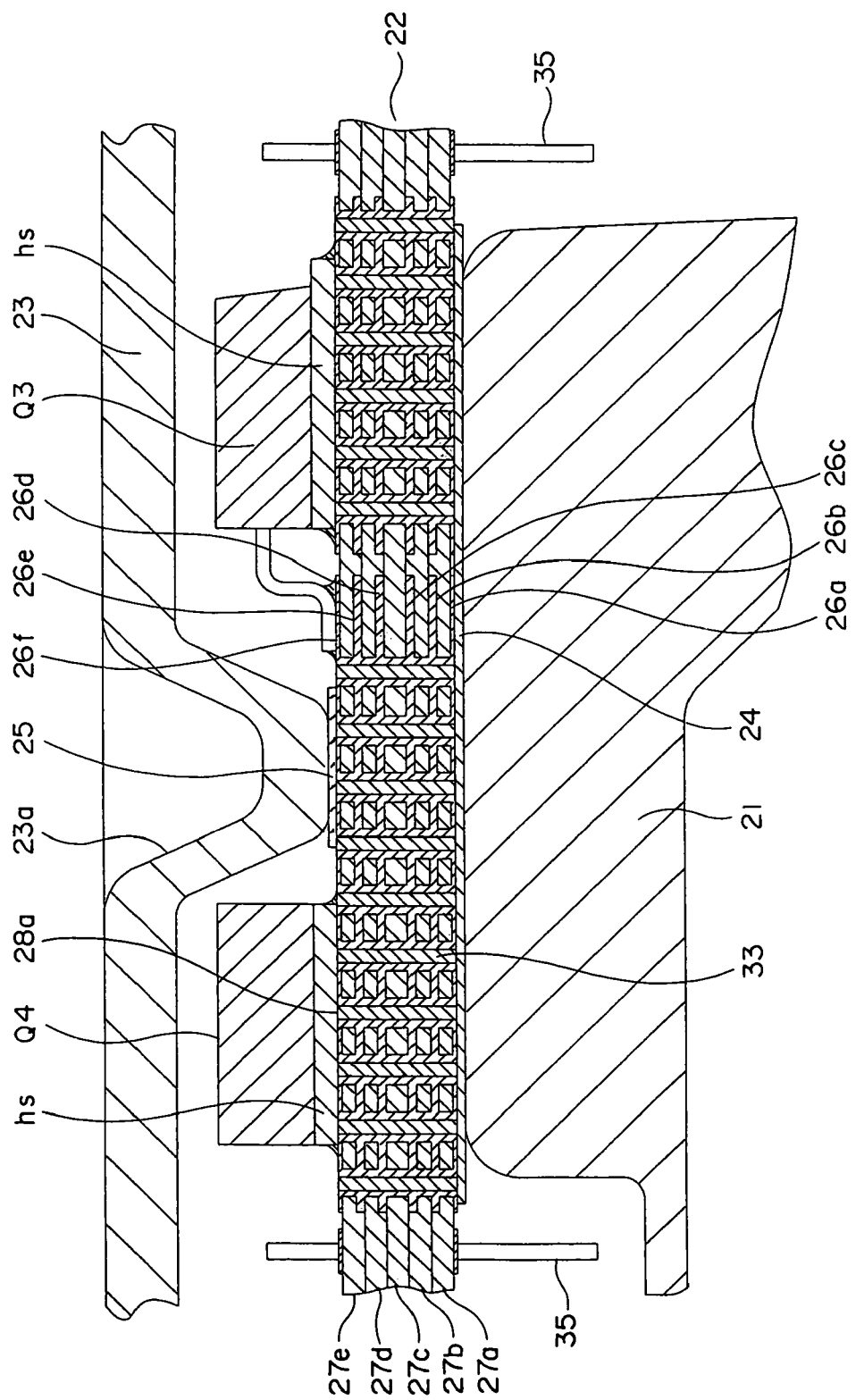
FIG. 3 is a cross sectional view showing semiconductor switching elements of a control unit and their peripheral portions.

FIG. 3 is a cross sectional view that shows the semiconductor switching elements Q1 through Q6 of the control unit and their peripheral portions.

A high thermal conductive material in the form of a high thermal conductive resin 33 is filled into the interior of the through hole 28a which has a copper plated layer formed on its inner surface.

A high thermal conductive insulating material in the form of a thermally conductive and electrically insulating sheet 24 is interposed between the outermost conductor layer 26a and the heat sink 21. The thermally conductive and electrically insulating sheet 24 is formed wider than a region that is arranged in opposition to the semiconductor switching elements Q1 through Q6 with the circuit board 22 sandwiched therebetween. That is, the thermally conductive and electrically insulating sheet 24 has an area larger than that of a region where the semiconductor switching elements Q1 through Q6 are arranged.

In addition, the semiconductor switching elements Q1 through Q6 are soldered onto the outermost conductor layer 26f of the circuit board 22 through the heat dissipation plates (heat spreaders) hs, respectively. A high thermal conductive insulating material in the form of a thermally conductive and electrically insulating sheet 25 is arranged in the vicinity of the semiconductor switching elements Q1 through Q6 on the conductor layer 26f. The thermally conductive and electrically insulating sheet 25 is in surface contact with a protruded portion 23a that is formed on the ceiling or upper surface of the cover 23 so as to protrude toward the circuit board 22 side.

Thus, the semiconductor switching elements Q1 through Q6 and their peripheral regions of the circuit board 22 are in surface contact with the heat sink 21 through the thermally conductive and electrically insulating sheet 24 on the heat sink side, and is also in surface contact with the protruded portion 23a of the cover 23 through the thermally conductive and electrically insulating sheet 25 at the opposite side of the heat sink 21.

A thermal conductive sheet 29, which is an excellent heat dissipation material having high conductivity and flexibility, is interposed between lower surfaces of the capacitors 30 and the heat sink 21, as shown in FIG. 2.

Here, the thickness of each of the outermost conductor layers 26a, 26f is set as 60 micrometers and the thickness of each of the inner conductor layers 26b, 26c, 26d, 26e is set as 105 micrometers, but these are one example, and may of course be set to different values.

In addition, when an increase in the thermal resistance of the circuit board 22 can be permitted, the high thermal conductive resin 33 need not be filled into the through hole 28a.

A bonding material of high thermal conductivity and high electrical insulation may be used instead of the thermally conductive and electrically insulating sheets 24, 25.

Also, a bonding material of high thermal conductivity may be used instead of the thermal conductive sheet 29.

The thermally conductive and electrically insulating sheet 24 need not necessarily be formed on the entire range of the region where the semiconductor switching elements Q1 through Q6 are arranged, but may instead be formed in individual areas that are arranged in opposition to the individual semiconductor switching elements Q1 through Q6, respectively.

Further, in place of the thermally conductive and electrically insulating sheet 25, there may be used a thermal conductivity insulator of a columnar shape with an increased total height which has one end face placed in surface contact with the flat cover and the other end face placed in surface contact with the conductor layer 26f.

The microcomputer 32 is mounted by soldering on the outermost conductor layer 26f of the circuit board 22, and low current parts such as peripheral circuit elements including a drive circuit (not shown) and a motor current detection circuit (not shown) are mounted by soldering on the conductor layers 26a, 26f at the opposite sides of the circuit board 22.

A control main body 22b composed of low current parts such as the microcomputer 32, its peripheral circuit elements, etc., is mounted on the circuit board 22 at its left side in the longitudinal direction thereof, as shown in FIG. 2.

The microcomputer 32 calculates an assist torque based on the motor current, which flows into the motor 1 through one end of the shunt resistor 31 and is detected by the motor current detection circuit (not shown), and a steering torque signal from a torque sensor (not shown), and calculates a current corresponding to the assist torque by feeding back the motor current and the rotational position of the rotor 4 detected by the rotational position sensor 6. Then, the microcomputer 32 outputs drive signals to control the semiconductor switching elements Q1 through Q6 of the bridge circuit.

In addition, the microcomputer 32 includes, though not illustrated, a well-known self-diagnosis function in addition to an AD converter, a PWM timer circuit, etc., and always carries out self-diagnosis so as to determine whether the system operates normally, so that it can interrupt the motor current upon occurrence of abnormality.

The power main body 22a composed of the high current parts and the control main body 22b composed of the low current parts are mounted on the single circuit board 22, and the individual current parts are electrically connected to one another by means of the conductor layers 26a through 26f and the through holes 28a, 28c through 28h, whereby signal transmission between the control main body 22b and the power main body 22a is carried out through the conductor layers 26a through 26f and the through holes 28a, 28c through 28h formed in the circuit board 22.

Figure 4:
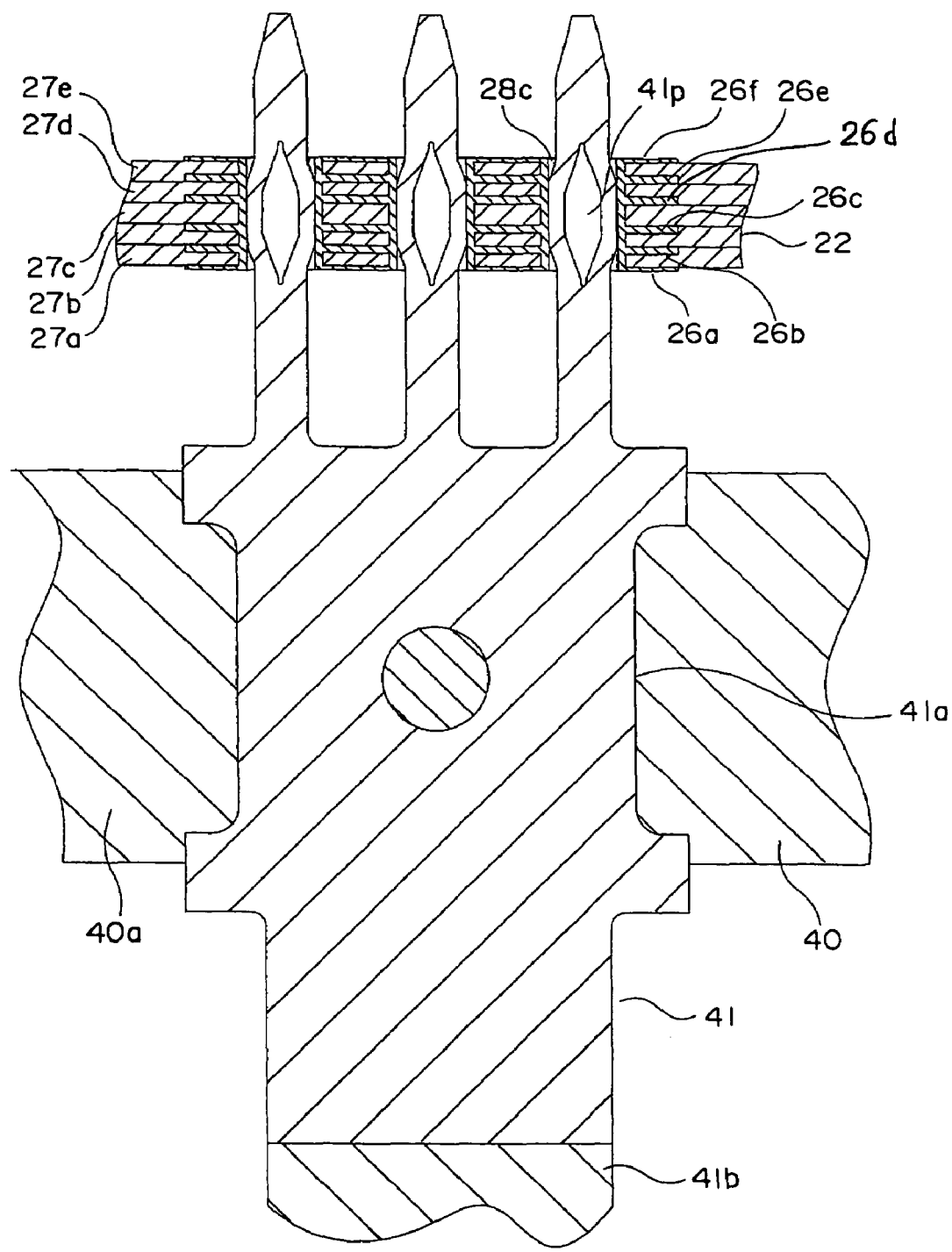
FIG. 4 is a partial cross sectional view showing a connecting member that electrically connects an electric motor and the control unit to each other.

FIG. 4 is a partial cross sectional view that shows a connecting member 40 electrically connecting the electric motor 1 and the control unit 20 to each other.

In the connecting member 40, an electrical conductor (hereinafter simply referred to as a conductor) 41 is integrated with an insulating resin body 40a by means of insert molding, and the conductor 41 is composed of a first conductive plate 41a and a second conductive plate 41b that is bonded at its one end by welding to one end of the first conductive plate 41a.

The first conductive plate 41a has the other end exposed from the insulating resin body 40a to form press-fit terminals 41p, and the second conductive plate 41b is formed at the other end thereof with motor terminals Mm.

The press-fit terminals 41p are press-fitted into a plurality of corresponding through holes 28c, each of which has a copper plated layer formed on an inner surface thereof, so as to provide electrical connection between the conductive plate 41 and the conductor layers 26a through 26f.

On the other hand, the motor terminals Mm are protruded from an opening portion 21a formed in the heat sink 21. The motor terminals Mm are inserted into the electric motor 1 and electrically connected with the winding terminals 10 thereby to provide electrical connection between the electric motor 1 and the control unit 20.

However, the press-fit terminals 41p are required to have high strength so as to be press-fitted into the through holes 28c in the circuit board 22. In contrast to this, the distances between the circuit board 22 and the individual winding terminals 10 are long, so the motor terminals Mm are required to have low electrical resistivity, and the motor terminals Mm are also required to have low rigidity so as to permit the adjustment of a positional displacement between the motor terminals Mm and the winding terminals 10 even if the displacement is caused by the mounting accuracy of the motor terminals Mm and/or the winding terminals 10.

Accordingly, the conductor 41 is composed of two members comprising the first conductive plate 41a and the second conductive plate 41b, and the first conductive plate 41a is made of phosphor bronze of high mechanical strength, and the second conductive plate 41b is made of a copper alloy of high electrical conductivity of IACS 80% or more. In addition, the first conductive plate 41a has a thickness of 0.8 mm, and the second conductive plate 41b has a thickness of 0.6 mm.

Figure 5:
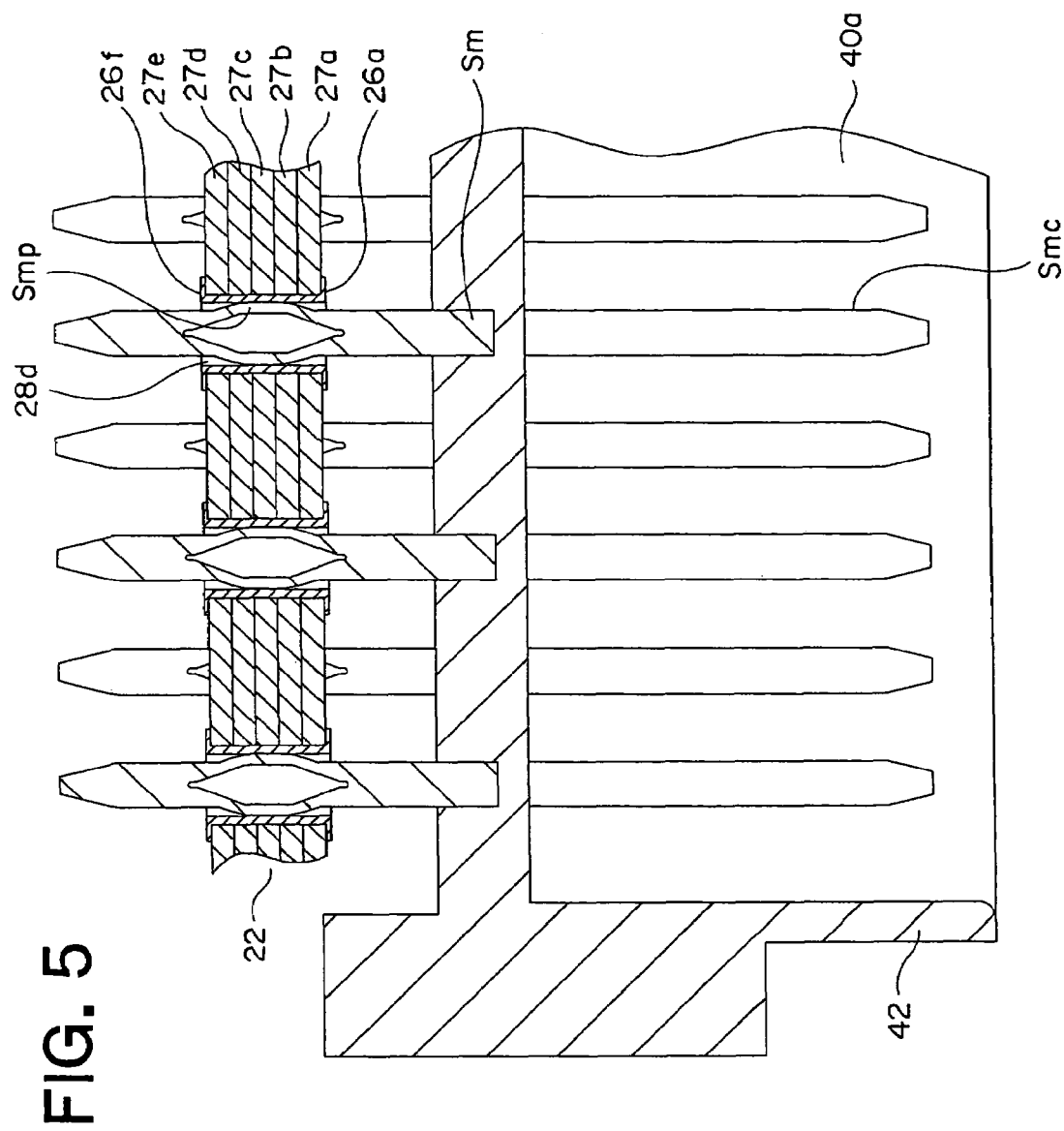
FIG. 5 is a partial cross sectional view showing a sensor connector integrally formed with the connecting member.
Figure 6:
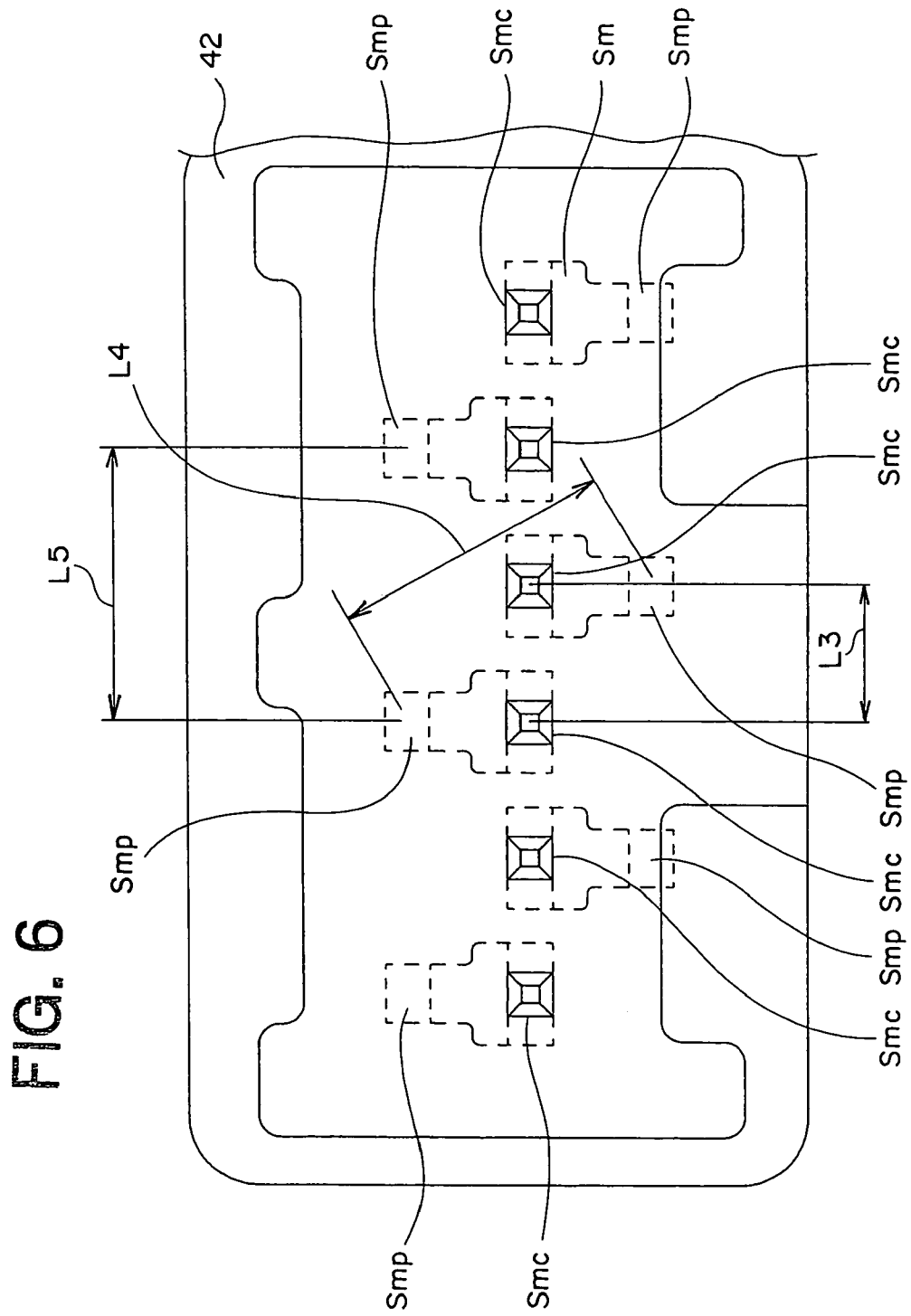
FIG. 6 is a partial bottom view when the sensor connector of FIG. 5 is seen from a heat sink.

FIG. 5 is a partial cross sectional view that shows a sensor connector 42 integrally formed with the connecting member 40, and FIG. 6 is a partial bottom view of the sensor connector 42 when the sensor connector of FIG. 5 is seen from a heat sink side.

The sensor connector 42 is connected to the rotational position sensor 6 through the connector 43 of the electric motor 1, so that a signal from the rotational position sensor 6 can be sent to the microcomputer 32.

The sensor connector 42 has six sensor terminal members Sm formed integrally with an insulating resin body 40a by means of insert molding. Each of the sensor terminal members Sm is formed at one end thereof with a press-fit terminal Smp and at the other end thereof with a connector terminal Smc.

The press-fit terminals Smp are exposed from the insulating resin body 40a, and are press-fitted into the through holes 28d in the circuit board 22 whereby they are electrically connected with the control main body 22b.

In order to reduce the size of the apparatus, the sensor connector 42 is formed such that each connector terminal Smc takes a square shape in cross section having a terminal width of 0.64 mm and a terminal thickness of 0.64 mm.

In this sensor connector 42, a distance L3 between the adjacent connector terminals Smc arranged in a row is set to 2 mm, and each of the through holes 28d has a hole diameter of 1 mm into which a corresponding press-fit terminal Smp is press-fitted.

However, in case where each sensor terminal member Sm is a linear in shape, when the connector terminals Smc are arranged in a row at intervals of 2 mm, the press-fit terminals Smp are also arranged in a row at intervals of 2 mm as they are. In this case, the intervals of the adjacent through holes 28d become 2 mm, too, and the distance between the inner surfaces of the adjacent through holes 28d each having a hole diameter of 1 mm becomes 1 mm.

If the press-fit terminals Smp are press-fitted into the individual through holes 28d, respectively, with the distance between such adjacent through holes 28d being short, the interlayer insulating layers 27a through 27e between the adjacent through holes 28d are damaged, and hence the insulation performance thereof are reduced.

In this embodiment, by perpendicularly bending an intermediate portion of each sensor terminal member Sm at two locations in directions different from each other, the connector terminals Smc are arranged in a row, with two rows of press-fit terminals Smp being disposed at the opposite sides of the row of the connector terminals Smc, respectively, as shown in FIG. 6.

By doing so, a distance L4 between the adjacent press-fit terminals Smp at the opposite sides and a distance L5 between the adjacent press-fit terminals Smp at the same side are increased, and similarly, a distance between the adjacent through holes 28d is necessarily increased, too. For instance, the distance L5 between the press-fit terminals Smp is extended twice to 4 mm.

Accordingly, the distance between the inner surfaces of the adjacent through holes 28d having a hole diameter of 1 mm becomes 3 mm, so damage to the interlayer insulating layers 27a through 27e between the adjacent through holes 28d can be reduced, thus making it possible to decrease the reduction of the insulation performance thereof.

Here, note that the press-fit terminals Smp are arranged in two rows at the opposite sides of the boundary connector terminals Smc arranged in the single row, but they may be arranged in three rows, for example.

In addition, although the distance between the adjacent through holes 28d is set to 4 mm, it is not limited to such a dimension, but may be set to an optimal distance in consideration of other factors such as the material of the interlayer insulating layers 27a through 27e, etc.

Figure 7:
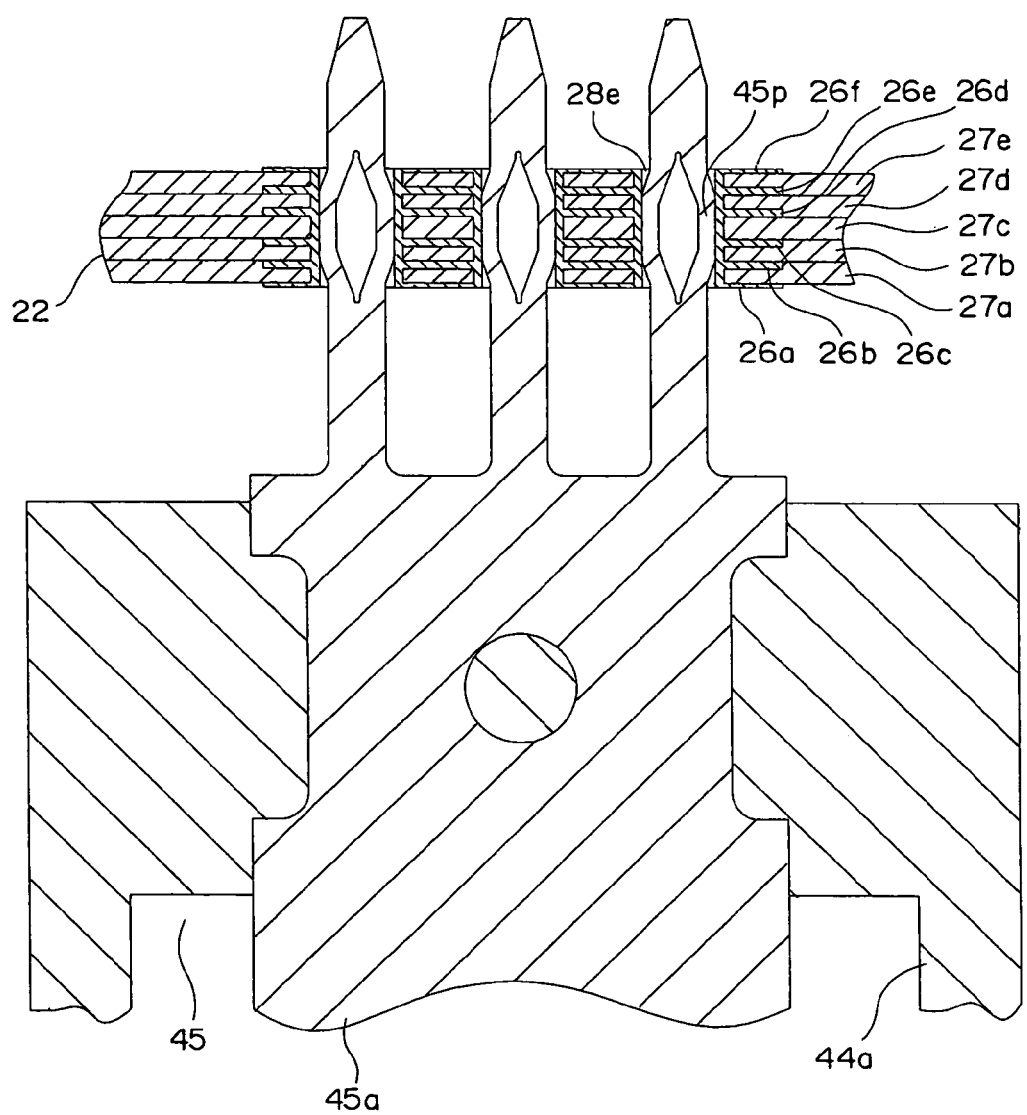
FIG. 7 is a partial cross sectional view showing a power connector of a connector unit.
Figure 8:
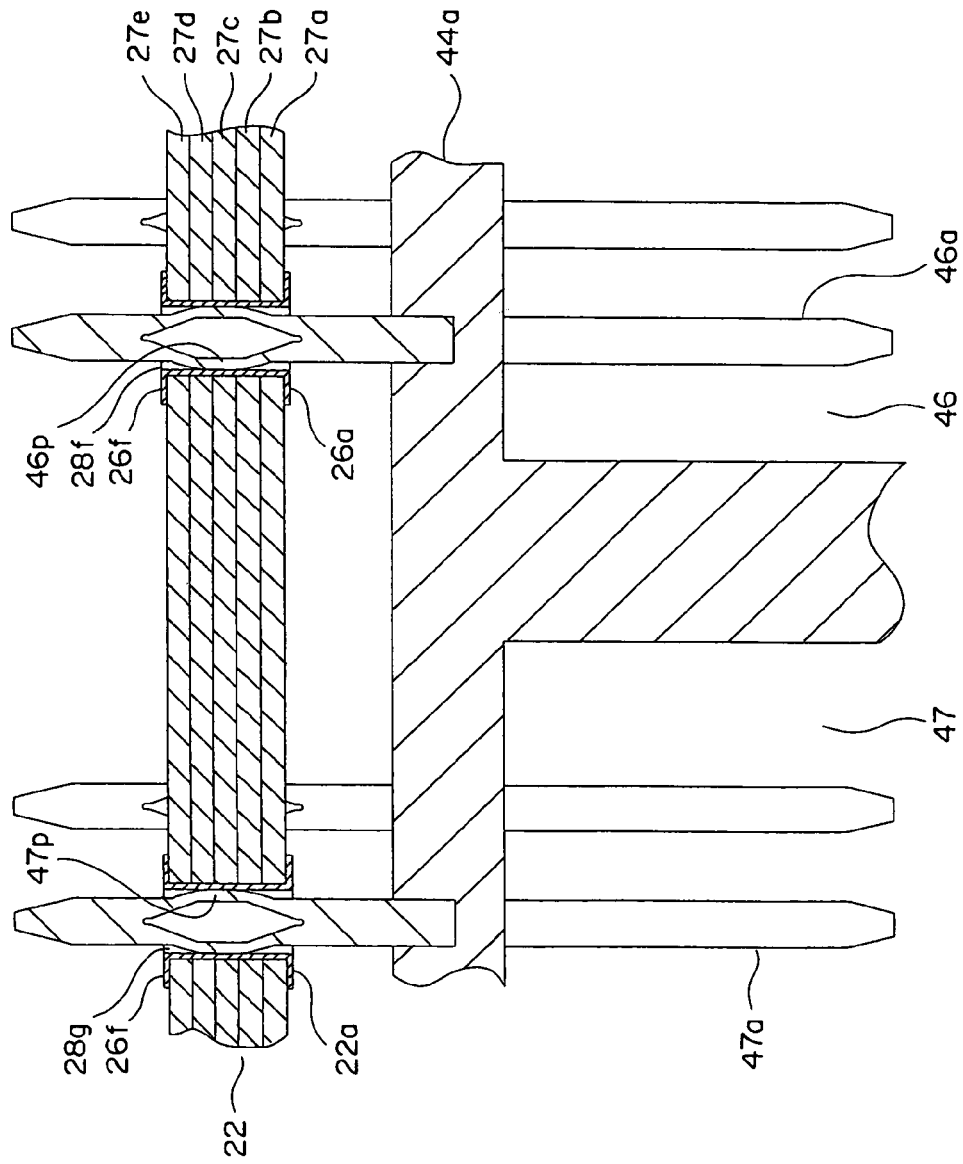
FIG. 8 is a partial cross sectional view showing a signal connector and a torque sensor connector of the connector unit.

FIG. 7 is a partial cross sectional view that shows a power connector 45 of a connector unit 44. FIG. 8 is a partial cross sectional view that shows a signal connector 46 and a torque sensor connector 47 of the connector unit 44.

The connector unit 44 is comprised of the power connector 45 electrically connected to a battery (not shown) of a vehicle, the signal connector 46 to and from which signals are input and output to a vehicle side through external wiring, and the torque sensor connector 47 to and from which a signal from a torque sensor (not shown) is input and output through external wiring.

The power connector 45, the signal connector 46 and the torque sensor connector 47 have a power terminal member 45a, signal terminal members 46a and torque sensor terminal members 47a, respectively, integrally molded with a connector housing 44a of the connector unit 44 by insert molding.

As shown in FIGS. 7 and 8, the power terminal member 45a, each signal terminal member 46a and each torque sensor terminal member 47a are formed at their one end with press-fit terminals 45p, 46p, 47p, respectively.

The press-fit terminals 45p, 46p, 47p are press-fitted into the through holes 28e, 28f, 28g, respectively, with copper plated layers being formed on the inner surfaces thereof.

As shown in FIG. 7, the press-fit terminals 45p are press-fitted into the through holes 28e, respectively, whereby the power terminal member 45a of the power connector 45 and the conductor layers 26a through 26f are electrically connected with each other.

Moreover, as shown in FIG. 8, the press-fit terminals 46p, 47p are press-fitted into the through holes 28f, 28g, respectively, so that the signal terminal members 46a of the signal connector 46 and the torque sensor terminal members 47a of the torque sensor connector 47 are electrically connected with the conductor layers 26a, 26f, respectively.

Similar to the sensor connector 42, terminals of the signal terminal members 46a at a side opposite to the press-fit terminals 46p and terminals of the torque sensor terminal members 47a at a side opposite to the press-fit terminals 47p are each arranged in a row, respectively, whereas the press-fit terminals 46p, 47p are each arranged in two rows, respectively.

Accordingly, individual distances between the adjacent press-fit terminals 46p, 47p are increased, and similarly, individual distances between the adjacent through holes 28f, 28g are also increased.

The press-fit terminals 41p of the connecting member 40, the press-fit terminals Smp of the sensor connector 42 formed integrally with the connecting member 40, and the press-fit terminals 45p, 46p, 47p of the connector unit 44 are press-fitted from the electric motor 1 side into the through holes 28c, 28d, 28e, 28f, 28g.

Figure 9:
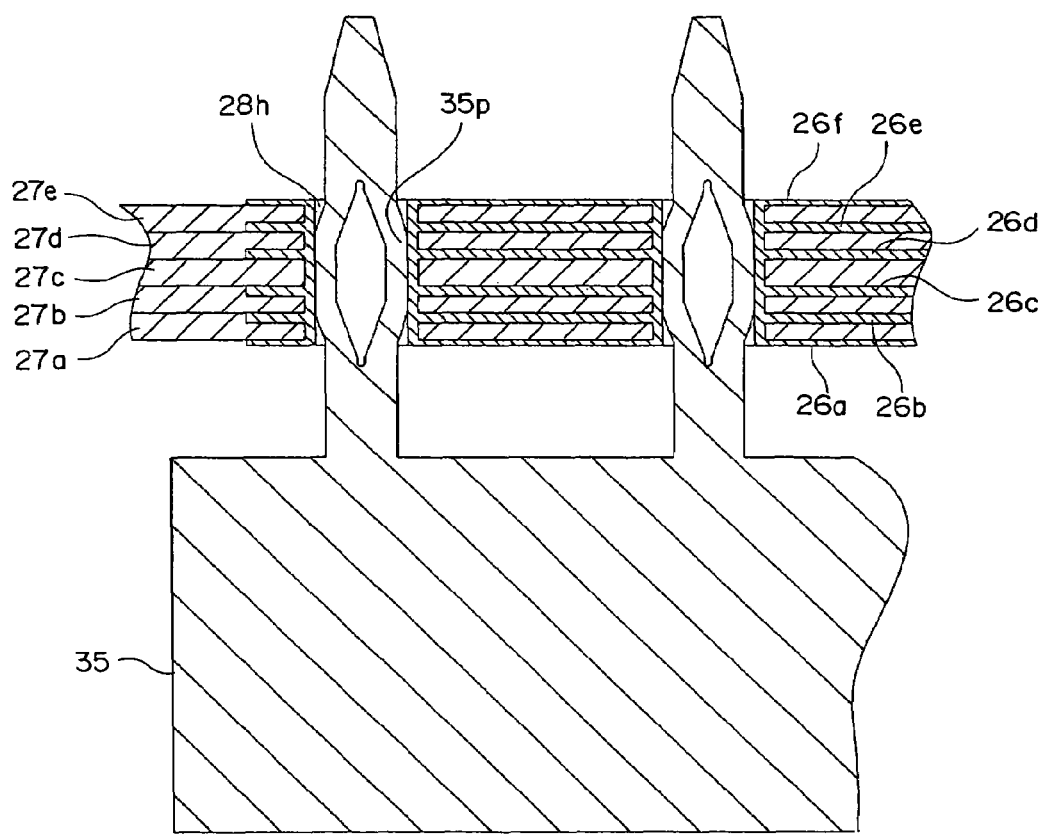
FIG. 9 is a partial cross sectional view showing a circuit board of the peripheral portions of the semiconductor switching elements.

FIG. 9 is a partial cross sectional view of the circuit board 22 around the semiconductor switching elements Q1 through Q6.

A pair of heat dissipation plates 35 each having press-fit terminals 35p formed at one end thereof are arranged upright at the opposite sides of the semiconductor switching elements Q1 through Q6 disposed at a short side of the rectangular circuit board 22.

The press-fit terminals 35p are press-fitted into a plurality of through holes 28h which have copper plated layers formed on their inner surfaces.

Since the heat dissipation plates 35 are arranged in the vicinity of the semiconductor switching elements Q1 through Q6, the heat generated by the semiconductor switching elements Q1 through Q6 is also dissipated from the heat dissipation plates 35 via the conductor layer 26f, the through holes 28a, the conductor layers 26a through 26f, and the through holes 28h.

The press-fit terminals 41p, 45p through which a large current flows each have a length of surface contact, with which they are in contact with the through holes 28c, 28e, extending to the vicinity of the conductor layers 26b, 26e so as to come into surface contact with at least two inner conductive layers 26c, 26d among the inner layers of the circuit board 22, as shown in FIG. 4 or FIG. 7.

Accordingly, even if variation occurs in the press-fitted positions of the press-fit terminals 41p, 45p when they are press-fitted into the through holes 28c, 28e, the press-fit terminals 41p, 45p are placed into surface contact with the conductor layers 26c, 26d through the metal plated layers on the inner surfaces of the through holes 28c, 28e in a reliable manner as long as the variation or positional displacement is not great.

In addition, since the conductor layers 26c, 26d are formed to have a thickness larger than that of each of the outermost conductor layers 26a, 26f, the electrical resistance of a path through which a large current flows is small, and the voltage drop and the heat generation of the press-fit connected portions or joints can be suppressed.

A space is formed at openings of the through holes 28c, 28e for holding scrapes or cut chips generated upon press fitting of the press-fit terminals 41p, 45p.

Now, reference will be made to a procedure of assembling the electric power steering apparatus, as constructed above.

First of all, the electric motor 1 is assembled, and for this purpose, the permanent magnet 3 is fixedly bonded to the output shaft 2 and then magnetized to eight poles by a magnetizer, after which an inner race of a bearing 50 is press-fitted over the output shaft 2 to form the rotor 4.

Thereafter, the armature windings 9 of U, V and W phases are wound around the twelve salient poles 7, respectively, of the stator 5 through the insulators 8 at locations displaced at an electrical angle of 120 degrees apart from one another, so that four windings are formed for each of U, V, and W phases, thus providing a total of twelve windings. The respective U-phase winding portions have their winding-start ends and winding-termination ends connected with one another to form an entire U-phase armature winding, and the V-phase and W-phase armature windings are also formed in the same manner. After formation of the armature windings of the U, V and W phases, the winding-termination ends thereof are mutually connected with one another to provide a neutral point, whereas the winding-start ends of the armature windings of the U, V and W phases are connected with the winding terminals 10, respectively.

Then, the stator 5 with the windings thus formed is press-fitted into a yoke 17.

Subsequently, after an outer race of a bearing 51 is fixedly attached to the housing 12, the stator 6b of the rotational position sensor 6 is fixedly attached to the housing 12. Then, the output shaft 2 of the rotor 4 is inserted into an inner race of the bearing 51. After a spacer 52 is press-fitted over the output shaft 2, the output shaft 2 is fixed to the inner race of the bearing 51. Further, the rotor 6a of the rotational position sensor 6 and the coupling 16 are press-fitted over the output shaft 2, and then, the yoke 17 into which the stator 5 is built is fitted and fixed to the housing 12 by means of screws 53.

Next, reference will be made to a procedure of assembling the control unit 20.

First of all, high current parts such as the semiconductor switching elements Q1 through Q6, the shunt resistors 31, etc., which constitute the power main body 22a, and low current parts such as the microcomputer 32, its peripheral circuit elements, etc., which constitute the control main body 22b, are mounted on the circuit board 22 with the individual electrodes on its surface near the cover 23 being coated with a cream solder, and the cream solder is then melted by using a reflow device, so that the above-mentioned respective component parts are soldered to the electrodes of the circuit board 22.

Similarly, high current parts such as the capacitors 30, the coil 34, etc., which constitute the power main body 22a, and low current parts, which constitute the control main body 22b, are mounted on a surface of the circuit board 22 at the heat sink 21 side, and a cream solder coated on electrodes on the heat sink side surface of the circuit board 22 is melted by using a reflow device, so that the above-mentioned respective parts are soldered to the electrodes of the circuit board 22.

Then, the press-fit terminals 41p, Smp, 45p, 46p, 47p, 35p of the connecting member 40, the sensor connector 42, the connector unit 44 and the heat dissipation plates 35 are press-fitted from the mounting surface side of the capacitors 30 into the through holes 28c, 28d, 28e, 28f, 28g, 28h, respectively, of the circuit board 22.

Thereafter, the circuit board 22 with the above-mentioned parts mounted thereon through the thermally conductive and electrically insulating sheet 24 is arranged on the heat sink 21, and the cover 23 is arranged in the opening portion of the heat sink 21 through the thermally conductive and electrically insulating sheet 25 on the circuit board 22, and is fixedly attached to the heat sink 21 by means of the screws 54.

Subsequently, the electric motor 1 and the control unit 20 separately assembled in the above manner are assembled with each other.

First of all, the control unit 20 is fixedly attached to the bracket 12a of the electric motor 1 by the screws 55. At this time, the electric motor side connector 43 and the control unit side connector 42 of the rotational position sensor 6 are engaged and electrically connected with each other.

Finally, by fastening the winding terminals 10 of the electric motor 1 and the motor terminals Mm of the control unit 20 for electrical connection therebetween by means of screws 56, the electric motor 1 and the control unit 20 are integrally coupled with each other, and the assembly of the electric power steering apparatus is thus completed.

As described in the foregoing, according to the electric power steering apparatus of this first embodiment, the high current parts constituting the power main body 22a and the low current parts constituting the control main body 22b are mounted on the opposite side surfaces of the single circuit board 22, respectively, and the power main body 22a and the control main body 22b are electrically connected to each other by the conductor layers 26a through 26f and the through holes 28a, 28c through 28h of the circuit board 22.

As a result, no external connecting member connecting between the power main body 22a and the control main body 22b is required, so the apparatus can be reduced in size and cost, and the reliability of electrical connection between the power main body 22a and the control main body 22b can be improved. Accordingly, the length of the electric path through which electric current flows between the power main body 22a and the control main body 22b can be decreased, thereby making it possible to reduce electric power loss, and to suppress the generation of electromagnetic noise.

In addition, the semiconductor switching elements Q1 through Q6 are mounted on one surface of the circuit board 22 at the cover 23 side, and the capacitors 30 are mounted on the other surface of the circuit board 22 at the heat sink 21 side opposite to the cover 23 side. Thus, there is no need to provide a cover having a protruded portion formed on its ceiling for receiving the capacitors 30 which are tall and large parts, and hence the cover 23 with a flat ceiling can be used, thereby making it possible to reduce the size of the apparatus as a whole.

Further, the above-mentioned plurality of through holes 28a formed in a region where the semiconductor switching elements Q1 through Q6 are mounted on the circuit board 22a are formed on their inner surfaces with metal plated layers, respectively, which are electrically connected to the above-mentioned conductor layers 26a through 26f. Accordingly, the heat generated by the semiconductor switching elements Q1 through Q6 is conducted through the through holes 28a in a straight line to be released to the heat sink 21, thus improving the heat dissipation of the apparatus.

Furthermore, the heat generated by the semiconductor switching elements Q1 through Q6, etc., can also be conducted to the conductor layers 26a through 26f via the through holes 28a, whereby heat in the circuit board 22 can be made uniform, so a temperature rise of heat-generating current parts constituting the power main body 22a can be suppressed, too.

Since a high thermal conductive material in the form of a high thermal conductive resin 33 is filled into the through holes 28a, thermal conductivity in the through holes 28a is high so a greater amount of heat can be released to the heat sink 21, thereby further improving the heat dissipation of the apparatus.

In addition, the circuit board 22 is formed in such a manner that each of the inner conductor layers 26b through 26e has a thickness greater than that of each of the outermost conductor layers 26a, 26f. As a result, electric power loss can be reduced by making a large current flow through the conductor layers 26b through 26e.

Further, the thickness of each of the outermost conductor layers 26a, 26f is formed thinner than that of each of the inner conductor layers 26b through 26e so that the current parts can be mounted on the outermost conductor layers 26a, 26f in a reliable manner. Accordingly, it becomes possible to form minute or micro patterns and improve part mounting density (packaging density), whereby the supply of a large current and high density packaging can be made compatible with each other, thus reducing the outside dimensions of the circuit board 22 and hence the size of the apparatus as a whole.

In addition, the circuit board 22 is fixedly attached to the heat sink 21 through the thermally conductive and electrically insulating sheet 24 of which the outermost conductor layer 26a is a high thermally conductive insulating material. As a result, the performance of insulation between the circuit board 22 and the heat sink 21 can be ensured, and heat from the circuit board 22 can be transmitted to the heat sink 21 in an efficient manner.

Moreover, in case where the thermally conductive and electrically insulating sheet 24 is interposed between the respective areas of the outermost conductor layer 26a arranged in opposition to the individual semiconductor switching elements Q1 through Q6 and the heat sink 21, that is, when the thermally conductive and electrically insulating sheet 24 is arranged only for the straight-line heat paths from the individual semiconductor switching elements Q1 through Q6, the heat from the individual semiconductor switching elements Q1 through Q6 is efficiently transmitted to the heat sink 21 through the thermally conductive and electrically insulating sheet 24, thus providing an advantageous effect that the thermally conductive and electrically insulating sheet 24 is reduced.

Since the cover 23 is connected with the outermost conductor layer 26f through the thermally conductive and electrically insulating sheet 25, the heat generated by the semiconductor switching elements Q1 through Q6, etc., is conducted to the conductor layer 26f and is released therefrom to the cover 23 via the thermally conductive and electrically insulating sheet 25, so the heat dissipation of the apparatus can be improved.

Further, the cover 23 is formed with the protruded portion 23a that protrudes to the circuit board 22 side to be placed in surface contact with the thermally conductive and electrically insulating sheet 25, so the cover 23 and the conductor layer 26f are thermally connected with each other with a simple construction.

In addition, the semiconductor switching elements Q1 through Q6 are fixedly mounted onto the outermost conductor layer 26f through heat dissipation plates (hs), and the thermally conductive and electrically insulating sheet 25 is arranged in the vicinity of the heat dissipation plates (hs). With such an arrangement, the heat generated by the semiconductor switching elements Q1 through Q6, etc., is conducted to the conductor layer 26f through the heat dissipation plates (hs) and is released therefrom to the cover 23 via the thermally conductive and electrically insulating sheet 25. As a result, the heat dissipation of the apparatus can be improved.

Moreover, the circuit board 22 is clamped between and fixed by the heat sink 21 and the cover 23, so there is no need to use fastening parts such as screws or the like for fastening the circuit board 22 to the heat sink 21, thus reducing the cost of manufacture.

Further, it is possible to improve the thermal conductivity between the cover 23 and the conductor layer 26f and between the heat sink 21 and the conductor layers 26a by enhancing both the adhesion of the thermally conductive and electrically insulating sheet 24 to the heat sink 21 and the conductor layer 26a and the adhesion of the thermally conductive and electrically insulating sheet 25 to the cover 23 and the conductor layer 26f.

Furthermore, in case where the circuit board 22 is fixed with its peripheral portions around the semiconductor switching elements Q1 through Q6 being clamped between the heat sink 21 and the cover 23, the heat generated by the semiconductor switching elements Q1 through Q6, etc., is released from the conductor layers 26a, 26f to the heat sink 21 and the cover 23 via the thermally conductive and electrically insulating sheets 24, 25. As a result, the heat dissipation of the apparatus can be improved.

Since the thermal conductive sheet 29, which is an excellent heat dissipation material having high thermal conductivity, is interposed between the capacitors 30 and the heat sink 21, the heat generated from the capacitors 30 is released to the heat sink 21 through the thermal conductive sheet 29 in addition to the circuit board 22, whereby the temperature rise of the capacitors 30 can be suppressed, and the durability of the capacitors 30 can be improved. In addition, the vibration of the capacitors 30 can be suppressed, whereby the vibration resistance of the apparatus can be improved, thus enhancing the reliability thereof.

Further, provision is made for the connecting member 40 electrically connecting the electric motor 1 and the control unit 20 to each other, and the connecting member 40 is provided with the conductor 41 that has one end thereof electrically connected with the circuit board 22 and the other end thereof in the form of the motor terminals Mm electrically connected with the winding terminals 10 by the screws 56 after having been inserted into the housing 12 of the electric motor 1. Accordingly, by mounting the electric motor 1 with the control unit 20 attached thereto onto the gear case 13, the connection portions between the motor terminals Mm and the winding terminals 10 are covered with the gear case 13, so it is not necessary to cover the connection portions with a separate part, thus making it possible to reduce the number of parts required and the cost of manufacture.

Also, the conductor 41 is connected directly with the circuit board 22, so the number of parts required can be decreased, thus making it possible to reduce the cost of manufacture and improve assemblability.

Moreover, the conductor 41 is formed at its one end with the press-fit terminals 41p, and the circuit board 22 has the through holes 28c formed therethrough with the metal plated layers being provided on the inner surfaces thereof. The press-fit terminals 41p of the conductor 41 are press-fitted into the through holes 28c in the circuit board 22 whereby the conductor 41 is electrically connected with the conductor layers 26a through 26f of the circuit board 22. Thus, the connection between the conductor 41 and the circuit board 22 is made by pressure contact due to the press fit, so the connection strength of the connection portions thereof against temperature change can be improved in comparison with the case where the connection is made by soldering, and hence the reliability of the apparatus can be improved.

In addition, since the connection between the conductive plate 41 and the circuit board 22 is carried out only by the press fit, the time of assembly can be shortened and the equipment for assembly can be simple, thus improving the assemblability of the apparatus.

Also, the conductor 41 is composed of the first conductive plate 41a and the second conductive plate 41b. The first conductive plate 41a is made of a material higher in mechanical strength than that for the second conductive plate 41b and is formed at its one end with the press-fit terminals 41p, and the second conductive plate 41b is made of a material higher in electrical conductivity than that for the first conductive plate 41a, and is electrically connected to the electric motor 1. Accordingly, the press-fit terminals 41p of the first conductive plate 41a of higher strength are connected with the circuit board 22 under pressure contact due to the press fit in a reliable manner. On the other hand, the second conductive plate 41b is lower in mechanical strength and rigidity than the first conductive plate 41a, so that even if a positional displacement between the motor terminals Mm and the winding terminals 10 is caused by the mounting accuracy of the motor terminals Mm and/or the winding terminals 10, such a positional displacement can be adjusted in an easy manner.

Since the second conductive plate 41b is made of a material of high electrical conductivity, electric power loss can be reduced even if the distance between the circuit board 22 and the winding terminals 10 is long, and the performance of the apparatus can be improved.

In addition, the first conductive plate 41a is made of phosphor bronze, which is a material of high mechanical strength that can be obtained at low cost, so the state of the pressure contact of the press fitting can be maintained for an extended period of time.

Also, the second conductive plate 41b is made of a copper alloy having an electrical conductivity of 80% IACS or more, which is a material of high electrical conductivity that can be obtained at low cost, so electric power loss can be reduced.

Moreover, since the second conductive plate 41b is formed thinner in thickness than the first conductive plate 41a, the rigidity of the connector 41 can be lowered with a simple construction, so a deviation or displacement in the mounting positions of the motor terminals Mm and the winding terminals 10 can be adjusted in an easy manner.

Specifically, the first conductive plate 41a made of phosphor bronze has a thickness of about 0.8 mm, and the second conductive plate 41b made of a copper alloy having an electrical conductivity of 80% IACS or more has a thickness of about 0.6 mm. Thus, the deviation or displacement in the mounting positions of the motor terminals Mm and the winding terminals 10 can be easily adjusted, and the conductor 41 need not be a large member, so the size of the apparatus can be reduced.

Since the connecting member 40 is formed integrally with the sensor connector 42 that is connected to the rotational position sensor 6, the work for assembling the sensor connector 42 to the circuit board 22 becomes easy, and the assemblability of the apparatus can be improved. Also, the number of parts required can be reduced, and hence the cost and size of the apparatus can be reduced.

Further, the sensor terminal members Sm of the sensor connector 42 each have a press-fit terminal Smp formed at one end portion thereof, and the circuit board 22 has the through holes 28d formed therethrough with the metal plated layers being provided on the inner surfaces thereof, respectively. The press-fit terminals Smp of the sensor terminal members Sm are press-fitted into the through holes 28d in the circuit board 22 whereby they are electrically connected with the conductor layers 26a, 26f of the circuit board 22. Accordingly, the connection between the sensor terminal member Sm and the circuit board 22 is made by pressure contact due to the press fit, so the connection strength of the connection portions thereof against temperature change can be improved in comparison with the case where the connection is made by soldering, and hence the reliability of the apparatus can be improved.

Furthermore, since the connection between the sensor terminal member Sm and the circuit board 22 is carried out only by the press fit, the time of assembly can be shortened and the equipment for assembly can be made simple, thus improving the assemblability of the apparatus.

In addition, the power connector 45 is provided which has the power terminal member 45a electrically connected to a power supply of the vehicle, with the press-fit terminals 45p being formed at one end of the power terminal member 45a, and the circuit board 22 has the through holes 28e formed therethrough with the metal plated layers being provided on the inner surfaces thereof, respectively. The press-fit terminals 45p of the power terminal member 45a are press-fitted into the through holes 28e in the circuit board 22 whereby the power terminal member 45a is electrically connected with the conductor layers 26a through 26f of the circuit board 22. Accordingly, the connection between the power terminal member 45a and the circuit board 22 is made by pressure contact due to the press fit, so the connection strength of the connection portions thereof against temperature change can be improved in comparison with the case where the connection is made by soldering, and hence the reliability of the apparatus can be improved. In addition, since the connection between the power terminal member 45a and the circuit board 22 is carried out only by the press fit, the time of assembly can be shortened and the equipment for assembly can be made simple, thus improving the assemblability of the apparatus.

Moreover, the signal connector 46 is provided which has the signal terminal members 46a to and from which a signal is input and output through external wiring, with the press-fit terminals 46p being formed at one end of the signal terminal members 46a, and the circuit board 22 has the through holes 28f formed therethrough with the metal plated layers being provided on the inner surfaces thereof, respectively. The press-fit terminals 46p of the signal terminal members 46a are press-fitted into the through holes 28f in the circuit board 22 whereby the signal terminal members 46a are electrically connected with the conductor layers 26a, 26f of the circuit board 22. Accordingly, the connections between the signal terminal members 46a and the circuit board 22 are made by pressure contact due to the press fit, so the connection strength of the connection portions thereof against temperature change can be improved in comparison with the case where the connections are made by soldering, and hence the reliability of the apparatus can be improved.

Since the connections between the signal terminal members 46a and the circuit board 22 are carried out only by the press fit, the time of assembly can be shortened and the equipment for assembly can be made simple, thus improving the assemblability of the apparatus.

Further, the torque sensor connector 47 is provided which has the torque sensor terminal members 47a to and from which a signal from the torque sensor is input and output through external wiring, with the press-fit terminals 47p being formed at one end of the torque sensor terminal members 47a, and the circuit board 22 has the through holes 28g formed therethrough with the metal plated layers being provided on the inner surfaces thereof, respectively. The press-fit terminals 47p of the torque sensor terminal members 47a are press-fitted into the through holes 28g in the circuit board 22 whereby the torque sensor terminal members 47a are electrically connected with the conductor layers 26a, 26f of the circuit board 22. Accordingly, the connections between the torque sensor terminal members 47a and the circuit board 22 are made by pressure contact due to the press fit, so the connection strength of the connection portions thereof against temperature change can be improved in comparison with the case where the connections are made by soldering, and hence the reliability of the apparatus can be improved.

Since the connections between the torque sensor terminal members 47a and the circuit board 22 are carried out only by the press fit, the time of assembly can be shortened and the equipment for assembly can be made simple, thus improving the assemblability of the apparatus.

Furthermore, since the power terminal member 45a, the signal terminal members 46a and the torque sensor terminal members 47a are integrally molded with the connector housing 44a made of an insulating resin, the work for assembling the connector unit 44 to the circuit board 22 becomes easy, and the assemblability of the apparatus can be improved. Also, the number of parts required can be reduced, and hence the cost and size of the apparatus can be reduced.

In addition, the circuit board 22 is provided with the heat dissipation plates 35 in the vicinity of the semiconductor switching elements Q1 through Q6, and the heat dissipation plates 35 are connected with the conductor layers 26a through 26f of the circuit board 22 through the through holes 28h formed in the circuit board 22. Thus, the heat generated by the semiconductor switching elements Q1 through Q6 is dissipated from the heat dissipation plates 35 via the conductor layer 26f, the through holes 28a, the conductor layers 26a through 26e, and the through holes 28h, whereby the heat dissipation of the apparatus can be improved.

Moreover, the heat dissipation plates 35 are each formed at one end thereof with the press-fit terminals 35p, and the circuit board 22 has the through holes 28h formed therethrough with the metal plated layers being formed on the inner surfaces thereof, respectively, and the press-fit terminals 35p of the heat dissipation plates 35 are press-fitted into the through holes 28h in the circuit board 22. Thus, the heat generated by the semiconductor switching elements Q1 through Q6 is dissipated from the heat dissipation plates 35 via the conductor layer 26f, the through holes 28a, the conductor layers 26a through 26e, and the through holes 28h, whereby the heat dissipation of the apparatus can be improved.

Since the press-fit terminals Smp, 35p, 41p, 45p, 46p, 47p are press-fitted into the through holes 28c through 28h formed in the circuit board 22 from the electric motor 1 side, the press-fitting of all the press-fit terminals Smp, 35p, 41p, 45p, 46p, 47p can be done in the same direction, so the assemblability of the apparatus can be improved.

Further, the press-fit terminals 35p, 41p, 45p have their connection portions with respect to the through holes 28c, 28e, 28h in the circuit board 22 arranged in opposition to at least two conductor layers 26c, 26d among the inner layers of the circuit board 22. Accordingly, even if variation occurs in the press-fitted positions of the press-fit terminals 35p, 41p, 45p when they are press-fitted into the through holes 28c, 28e, 28h, the press-fit terminals 35p, 41p, 45p are placed into surface contact with the conductor layers 26c, 26d with the metal plated layers on the inner surfaces of the through holes 28c, 28e sandwiched therebetween in a reliable manner as long as the variation or positional displacement is not great. As a result, the tolerance of the variation of the press-fitted positions of the press-fit terminals 35p, 41p, 45p becomes large, and hence the assemblability of the apparatus is improved.

Since the press-fit terminals 35p, 41p, 45p are in surface contact with the at least two conductor layers 26c, 26d, the cross sectional area of a current path through which electric current flows is large and hence the electrical resistance of the current path becomes small, so the voltage drop and the heat generation of the press-fit connected portions or joints can be suppressed, thereby improving the performance of the apparatus.

Furthermore, the distance between any adjacent press-fit terminals Smp is longer than the distance between any adjacent connector terminals Smc, and the distance between any adjacent press-fit terminals 46p of the signal terminal members 46a of the signal connector 46 is longer than the distance between any adjacent terminals of the signal terminal members 46a at a side opposite to the press-fit terminals 46p. Also, the distance between any adjacent press-fit terminals 47p of the torque sensor terminal members 47a of the torque sensor connector 47 is longer than the distance between any adjacent terminals of the torque sensor terminal members 47a at a side opposite to the press-fit terminals 47p. Accordingly, it is possible to prevent damage to the interlayer insulating layers 27a through 27e between the adjacent through holes 28d, 28f, 28g and hence the reduction of insulation performance, thereby improving the reliability of the press-fit connections.

In addition, the coil 34 is mounted on a surface of the circuit board 22, on which the capacitors 30 are mounted, for preventing the noise generated upon switching of the semiconductor switching elements Q1 through Q6 from being leaked to the outside. Accordingly, there is no need to provide a cover having a protruded portion formed on its ceiling for receiving the coil 34 which is a tall and large part, and hence the cover 23 with a flat ceiling can be used, thus making it possible to reduce the size of the apparatus as a whole.

Since the capacitors 30 and the coil 34 are surface-mounted high current parts and mounted on one and the same surface of the circuit board 22, there is no need to separately employ a step of performing soldering by use of a reflow device, and a step of inserting leads of the capacitors 30 and the coil 34 into the through holes in the circuit board 22 and performing partial jet soldering, as a result of which assemblability can be improved.

Although in the above-mentioned embodiment, the number of magnetic poles of the permanent magnet 3 is eight and the number of salient poles of the stator 5 is twelve, the present invention is not limited to such a combination, but any combination of the number of magnetic poles and the number of salient poles may be employed for the purpose of the invention.

Although the circuit board 22 is formed of a six-layer substrate, another substrate may be used which includes another number of layers such as a four-layer substrate, an eight-layer substrate, etc.

Although the metal plated layers on the inner surfaces of the through holes 28d, 28f, 28g are electrically connected with the outermost conductor layers 26a, 26f of the circuit board 22, they may instead be electrically connected with the inner conductor layers 26b through 26e.

In addition, the metal plated layers on the inner surfaces of the through holes 28d, 28f, 28g may be electrically connected with either one or some plurality of conductor layers among the conductor layers 26a through 26f of the circuit board 22.

Although a resolver is used as the rotational position sensor 6, the present invention is not limited to the use of such a resolver, but other magnetic sensing elements such as a magneto-resistive element, a Hall element, a Hall IC or the like may instead be used.

Further, the electric motor 1 is not limited to a blushless motor, but an induction motor or a switched reluctance motor (SR motor) may instead be used.

While the invention has been described in terms of a preferred embodiment, those skilled in the art will recognize that the invention can be practiced with modifications within the spirit and scope of the appended claims.

What is claimed is:

1. An electric power steering apparatus including an electric motor for outputting assist torque to a steering wheel of a vehicle, and a control unit for controlling the driving of said electric motor, wherein said control unit comprises:

a power main body including a plurality of semiconductor switching elements for switching a current supplied to said electric motor in accordance with torque assisting said steering wheel, and a plurality of high current parts including capacitors for absorbing ripples of said current;

a control main body that includes a plurality of low current parts including a microcomputer for generating drive signals to control the driving of said semiconductor switching elements based on the steering torque of said steering wheel;

a circuit board that has a plurality of insulating layers and a plurality of conductor layers forming wiring patterns laminated one over another, and a plurality of through holes formed therethrough, with said power main body and said control main body being mounted thereon; and a heat sink that receives said circuit board and is made of a metal material of high conductivity; and wherein said high current parts and said low current parts are mounted on the opposite side surfaces of said circuit board, respectively, and are electrically connected with one another through said conductor layers and said through holes.

2. The electric power steering apparatus as set forth in claim 1, wherein said semiconductor switching elements and said capacitors are mounted on different surfaces of said circuit board, respectively.

3. The electric power steering apparatus as set forth in claim 1, wherein said semiconductor switching elements are mounted on a surface of said circuit board at a side opposite to said heat sink fixedly attached to said electric motor.

4. The electric power steering apparatus as set forth in claim 1, wherein a respective metal plated layer is formed on an inner surface of each of said plurality of through holes formed in a region where said semiconductor switching elements are mounted on said circuit board, wherein each of said metal plated layers are electrically connected to said conductor layers.

5. The electric power steering apparatus as set forth in claim 4, wherein a high thermal conductive material is filled into said through holes.

6. The electric power steering apparatus as set forth in claim 1, wherein said circuit board is formed in such a manner that each of said inner conductor layers has a thickness greater than that of each of said outermost conductor layers.

7. The electric power steering apparatus as set forth in claim 1, wherein said outermost conductor layer of said circuit board is fixedly attached to said heat sink through a thermally conductive and electrically insulating material.

8. The electric power steering apparatus as set forth in claim 7, wherein said thermally conductive and electrically insulating material is interposed between the respective areas of said outermost conductor layer, which are arranged in opposition to said individual semiconductor switching elements, and said heat sink.

9. The electric power steering apparatus as set forth in claim 1, wherein said control unit is provided with a cover that cooperates with said heat sink to receive said circuit board, and said cover is connected with said outermost conductor layer through a thermally conductive and electrically insulating material.

10. The electric power steering apparatus as set forth in claim 9, wherein said cover is formed with a protruded portion which is protruded toward said circuit board so as to be in surface contact with said electrically insulating material.

11. The electric power steering apparatus as set forth in claim 9, wherein said semiconductor switching elements are fixedly attached to said outermost conductive layer through heat dissipation plates, respectively, and said electrically insulating material is arranged in the vicinity of said heat dissipation plates.

12. The electric power steering apparatus as set forth in claim 7, wherein said electrically insulating material comprises a thermally conductive and electrically insulating sheets.

13. The electric power steering apparatus as set forth in claim 9, wherein said circuit board is clamped between and fixed by said heat sink and said cover.

14. The electric power steering apparatus as set forth in claim 13, wherein said circuit board is fixed with its peripheral portions around said semiconductor switching elements being clamped between said heat sink and said cover.

15. The electric power steering apparatus as set forth in claim 1, further comprising a heat dissipation material of high thermal conductivity that is interposed between said capacitors and said heat sink.

16. The electric power steering apparatus as set forth in claim 15, wherein said heat dissipation material comprises a thermal conductive sheet.

17. The electric power steering apparatus as set forth in claim 1, further comprising a connecting member that electrically connects said electric motor and said control unit to each other, wherein said connecting member is provided with an electrical conductor that has one end portion thereof electrically connected to said circuit board, and the other end portion thereof inserted into said electric motor so as to be electrically connected therewith.

18. The electric power steering apparatus as set forth in claim 17, wherein said electrical conductor has press-fit terminals formed at the one end portion thereof, and said circuit board has through holes formed therethrough with metal plated layers being formed on inner surfaces thereof, respectively, and said press-fit terminals of said conductor are press-fitted into said through holes in said circuit board thereby to provide electrical connection between said conductor and said conductor layers of said circuit board.

19. The electric power steering apparatus as set forth in claim 17, wherein said conductor is composed of a first conductive plate and a second conductive plate, and said first conductive plate is made of a material higher in mechanical strength than that for said second conductive plate and is formed at its one end with said press-fit terminals, and said second conductive plate is made of a material higher in electrical conductivity than that for said first conductive plate, and is formed at its one end with motor terminals electrically connected to said electric motor.

20. The electric power steering apparatus as set forth in claim 19, wherein said first conductive plate is made of phosphor bronze.

21. The electric power steering apparatus as set forth in claim 19, wherein said second conductive plate is made of a copper alloy having an electrical conductivity of 80% IACS or more.

22. The electric power steering apparatus as set forth in claim 19, wherein said second conductive plate is formed thinner in thickness than said first conductive plate.

23. The electric power steering apparatus as set forth in claim 22, wherein said first conductive plate has a thickness of about 0.8 mm, and said second conductive plate has a thickness of about 0.6 mm.

24. The electric power steering apparatus as set forth in claim 17, wherein said connecting member is integrally formed with a sensor connector that is connected to a rotational position sensor for detecting the rotational position of a rotor of said electric motor.

25. The electric power steering apparatus as set forth in claim 24, wherein said sensor connector has sensor terminal members that each have a press-fit terminal formed at one end portion thereof, and said circuit board has through holes formed therethrough with metal plated layers being provided on inner surfaces thereof respectively, and said press-fit terminals of said sensor terminal members are press-fitted into said through holes in said circuit board whereby said press-fit terminals are electrically connected with said conductor layers of said circuit board.

26. The electric power steering apparatus as set forth in claim 1, further comprising a power connector that has a power terminal member electrically connected with a power supply of said vehicle, wherein said power terminal member has press-fit terminals formed at one end thereof, and said circuit board has through holes formed therethrough with metal plated layers being provided on inner surfaces thereof, respectively, and said press-fit terminals of said power terminal member are press-fitted into said through holes in said circuit board whereby said power terminal member is electrically connected with said conductor layers of said circuit board;
said electric power steering apparatus further comprising a signal connector that has signal terminal members to and from which a signal is input and output through external wiring, wherein each of said signal terminal members has a press-fit terminal formed at one end thereof, and said circuit board has through holes formed therethrough with metal plated layers being provided on inner surfaces thereof, respectively, and said press-fit terminals of said signal terminal members are press-fined into said through holes in said circuit board whereby said signal terminal members are electrically connected with said conductor layers of said circuit board;
said electric power steering apparatus further comprising a torque sensor connector that has torque sensor terminal members to and from which a signal from a torque sensor is input and output through external wiring, wherein each of said torque sensor terminal members has a press-fit terminal formed at one end thereof, and said circuit board has through holes formed therethrough with metal plated layers being provided on inner surfaces thereof, respectively, and said press-fit terminals of said torque sensor terminal members are press-fined into said through holes in said circuit board whereby said torque sensor terminal members are electrically connected with said conductor layers of said circuit board.

27. The electric power steering apparatus as set forth in claim 26, wherein said power terminal member, said signal terminal members and said torque sensor terminal members are integrally molded with a connector housing made of an insulating resin.

28. The electric power steering apparatus as set forth in claim 1, wherein said circuit board is provided with heat dissipation plates in the vicinity of said semiconductor switching elements, and said heat dissipation plates are connected with said conductor layers of said circuit board via through holes formed in said circuit board.

29. The electric power steering apparatus as set forth in claim 28, wherein said heat dissipation plates are each formed at one end thereof with press-fit terminals, and said circuit board has through holes formed therethrough with metal plated layers being provided on inner surfaces thereof, respectively, and said press-fit terminals of said heat dissipation plates are press-fined into said through holes in said circuit board.

30. The electric power steering apparatus as set forth in claim 25, wherein said press-fit terminals are press-fitted into said through holes formed in said circuit board from an electric motor side.

31. The electric power steering apparatus as set forth in claim 25, wherein said press-fit terminals have their connection portions with respect to said through holes in said circuit board arranged in opposition to at least two conductor layers among said inner layers of said circuit board.

32. The electric power steering apparatus as set forth in claim 25, wherein said sensor terminal members of said sensor connector each have a connector terminal formed at the other end portion thereof, and a distance between any adjacent press-fit terminals is longer than a distance between any adjacent connector terminals.

33. The electric power steering apparatus as set forth in claim 26, wherein a distance between any adjacent press-fit terminals of said signal terminal members of said signal connector is longer than a distance between any adjacent terminals of said signal terminal members at a side opposite to said press-fit terminals, and a distance between any adjacent press-fit terminals of said torque sensor terminal members of said torque sensor connector is longer than a distance between any adjacent terminals of said torque sensor terminal members at a side opposite to said press-fit terminals.

34. The electric power steering apparatus as set forth in claim 1, wherein a coil for preventing the noise generated upon switching of said semiconductor switching elements from being leaked to the outside is mounted on a surface of said circuit board on which said capacitors are mounted.

35. The electric power steering apparatus as set forth in claim 34, wherein said capacitors and said coil comprise surface-mounted high current parts.

36. An electric power steering apparatus including an electric motor for outputting assist torque to a steering wheel of a vehicle, and a control unit for controlling the driving of said electric motor, wherein said control unit comprises:

a power main body including a plurality of semiconductor switching elements for switching a current supplied to said electric motor in accordance with torque assisting said steering wheel, and a plurality of high current parts including capacitors for absorbing ripples of said current;

a control main body that includes a plurality of low current parts including a microcomputer for generating drive signals to control the driving of said semiconductor switching elements based on the steering torque of said steering wheel;

a circuit board that has a plurality of insulating layers and a plurality of conductor layers forming wiring patterns laminated one over another, and a plurality of through holes formed therethrough, with said power main body and said control main body being mounted thereon; and a metal plated layer disposed on an inner surface of each of said through holes and electrically connected to said conductor layers, wherein said high current parts and said low current parts are mounted on the opposite side surfaces of said circuit board, respectively, and are electrically connected with one another through said conductor layers and said metal plated layers on said inner surfaces of said through holes.

* * * * *